United States Patent [19]
Meyer et al.

[11] Patent Number: 5,799,026
[45] Date of Patent: Aug. 25, 1998

[54] INTERBAND QUANTUM WELL CASCADE LASER, WITH A BLOCKING QUANTUM WELL FOR IMPROVED QUANTUM EFFICIENCY

[75] Inventors: Jerry Meyer, Catonsville; Igor Vurgaftman, Pikesville, both of Md.; Ruan Q. Yang, Houston, Tex.

[73] Assignee: The United States of America as represented by the Secretary of the Navy

[21] Appl. No.: 743,433

[22] Filed: Nov. 1, 1996
(Under 37 CFR 1.47)

[51] Int. Cl.$^6$ ...................................................... H01S 3/19
[52] U.S. Cl. .................... 372/45; 372/43; 257/97; 257/22
[58] Field of Search ................... 372/45.43; 257/97.22

[56] References Cited

U.S. PATENT DOCUMENTS

| | | | |
|---|---|---|---|
| 5,079,601 | 1/1992 | Esaki et al. | 357/4 |
| 5,416,338 | 5/1995 | Suzuki et al. | 257/21 |
| 5,588,015 | 12/1996 | Yang | 372/45 |

Primary Examiner—Rodney B. Bovernick
Assistant Examiner—Ellen E. Kang
Attorney, Agent, or Firm—Thomas E. McDonnell; John Karasek

[57] ABSTRACT

A gain region for an interban quantum well laser incudes (a) an emitter region of semiconductor material having at least one conduction subband and at least one valence subband, these subbands being spaced apart by an energy band-gap; (b) a collector region of semiconductor material having at least one conduction subband and at least one valence subband, these subbands spaced apart by an energy band-gap; (c) a type-I or type-II active region; and (d) a blocking quantum well region of semiconductor material between the active region and the collector region, for keeping electrons in the active region from tunnelling or scattering into the collector region, but allowing electrons in the highest valence subband in the active region to pass into the collector region. Another aspect of the invention is a cascade laser made from a stack of these gain regions, connected in series, optical cladding regions at opposing ends of the stack, and a voltage source for applying a bias voltage to the stack, and an optical cavity perpendicular to the stacking axis fabricated by cleaving or other means.

26 Claims, 4 Drawing Sheets

# INTERBAND QUANTUM WELL CASCADE LASER, WITH A BLOCKING QUANTUM WELL FOR IMPROVED QUANTUM EFFICIENCY

BACKGROUND OF THE INVENTION

1. Field of the Invention

This invention relates to semiconductor light emitting devices and more particularly, to electrically-pumped quantum well semiconductor infrared lasers having improved quantum efficiency, gain, current density threshold for lasing, output power, and operating temperature.

2. Description of the Related Art

There is a rapidly growing demand for efficient IR diode lasers operating either at ambient or at temperatures accessible with a thermoelectric cooler (T≧~180K), particularly for the mid-wavelength infrared (MWIR). Military needs center on IR countermeasures and communications, while high-volume commercial applications include remote chemical sensing for pollution and drug monitoring, leak detection, chemical process control, and laser surgery. In both markets, system development cannot proceed until improved MWIR sources become available.

Despite reports of dramatic improvements in the performance of diode lasers emitting at IR wavelengths out to about 2.5 µm, the development of longer-wavelength diodes with high output powers and non-cryogenic operating temperatures has proven to be much more challenging. Fundamental mechanisms limiting the performance of previous diode lasers operating at MWIR wavelengths ≧3 µm have included inadequate electrical confinement due to small conduction and/or valence band offsets, and the increasing predominance of Auger recombination when the energy gap is lowered and the temperature raised. The nonradiative decay in many of the III–V systems currently under investigation tend to be dominated by the so-called CHHS Auger process, in which the conduction-to-heavy-hole (CH) recombination is accompanied by a heavy-to-split-off-hole (HS) transition. In InAs-rich alloys such as InAsSb, InAsSbP, and InGaAsSb, this process often easily conserves both momentum and energy because the energy gap $E_g$ is nearly equal to the split-off gap $\Delta_0$.

It is known that type-II heterostructures produce substantial gain as long as the electrical confinement is adequate and the nonradiative lifetime is long enough that a population inversion can be established.

Conduction and valence band offsets are much larger in narrow-gap type-II structures, and Auger losses can be minimized. However, as in the case of other conventional bipolar diode lasers, the maximum output power for a practical stripe width is far below the 1 W range required for many applications. This is inevitable, since the differential slope efficiency scales inversely with wavelength, hence whereas the same current is required to inject one electron-hole pair as in a near-IR (λ=1 µm) system, the energy of the photon that results is at least 3 times smaller.

One approach to circumventing this fundamental limitation is the intersubband quantum cascade laser as described by Faist et al. in Science 264 (Apr. 22, 1994), with unipolar electrical injection, which can in principle emit as many photons as there are periods in the structure. However, the threshold current density tends to be rather large, owing to rapid non-radiative phonon relaxation of the inversion.

One effort to overcome this shortcoming is set forth in a U.S. Patent Application by Rui Q. Yang, copending herewith, for "LIGHT EMITTING DEVICES BASED ON INTERBAND TRANSITIONS IN TYPE-II QUANTUM WELL HETEROSTRUCTURES", foreign priority based upon Canada Application No. 2,150,499, filed May 30, 1995. The interband transitions of this laser do not have allowed non-radiative phonon transitions that would deplete the upper gain level and impede the formation of a population inversion.

Energy levels of a single period of the gain region of the Yang laser are depicted in FIG. 1. The device of FIG. 1 comprises a first quantum well (QW) region 12 and a second QW region 14 sandwiched between an emitter region 16 and a collector region 18. The minimum energy of the lowest conduction subband of the first active region QW 12 is higher than the maximum energy of the highest valence subband of the second active region QW 14. Emitter layer 16 is separated from the first QW region 12 by barrier 20 and collector layer 18 is separated from the second QW region 14 by barrier 22. The first QW region 12 is separated from the second QW region 14 by tunnel barrier 24 which can be zero thickness. The band edges of barrier layers 20, 22 and 24 are not shown and may vary for particular material systems, but it should be understood that their band-gaps must be wide enough to provide the necessary carrier confinement. Barrier layers 20, 22, and 24 can vary in thickness, but should be thin enough so that carriers can tunnel through the layers.

As shown in FIG. 1, under applied bias at least one energy subband $E_e$ is formed in the conduction band of the first QW region 12 and at least one energy subband $E_h$ which is lower than $E_e$ in energy is formed in the valence band of the second QW region 14. The minimum energy of the electron subband $E_e$ resides in the band-gap of the second QW region 14 and simultaneously near the conduction band minimum of the emitter layer 16. The maximum of the valence band energy $E_h$ resides in the band-gap of the emitter layer 16 and above the conduction band minimum of the collector layer 18.

Under an appropriate forward bias, i.e. the collector layer 18 biased positively with respect to the emitter layer 16, electrons will tunnel through from the conduction band of emitter layer 16 through barrier layer 20 to the energy subband $E_e$ as depicted by arrow 26. Preferably, the electrons relax to state $E_h$ as depicted by arrow 27, which if the relaxation is radiative will result in the emission of a photon of energy $\hbar\omega$ depicted by arrow 28. The photon energy of the emitted light will be approximately equal to the energy difference between the minimum energy of subband $E_e$ and the maximum energy of subband $E_h$. The recombined electrons in subband $E_h$ then tunnel through barrier 22 to the collector region 18 as depicted by arrow 29. This is the only path for the electrons in subband $E_h$ leaving subband $E_h$ since $E_h$ resides in the band-gap of emitter region 16 which prevents electrons from tunneling back to 16. Since subbands $E_e$ and $E_h$ are localized mainly in region 12 and region 14 respectively, the relaxation between the two subbands can be easily manipulated to be much slower than the tunneling process for carriers from region 14 to region 18, facilitating the establishment of sufficient population inversion between the two subbands. Furthermore, because the electrons relax from a conduction subband to a valence subband, in contrast to the transition between two conduction subbands in the quantum cascade laser as described by Faist et al. in Science, Vol. 264, Apr. 22, 1994, and the intrawell intersubband transitions as shown by Yang et al. in Appl. Phys. Lett. Vol. 59 (2), 1994, the non-radiative relaxation via phonon scattering will be greatly suppressed and a higher radiative efficiency can in principle be achieved.

However, there will be inherent tradeoffs in designing a laser such as the one described above. Consider the thickness of QW region 14. If this layer is too thin, electrons will be able to tunnel directly from QW region 12 to collector region 18. This leakage will inhibit the formation of a population inversion and the laser may not operate, or may operate with poor efficiency. Conversely, if this layer is too thick, there will be poor overlap between the electron and hole wavefunctions in the active quantum wells, and again the laser may not operates because losses may exceed the gain which is proportional to the square of the wavefunction overlap. A way to simultaneously minimize leakage and maximize the gain is required if the interband cascade laser is to operate efficiently.

SUMMARY OF THE INVENTION

Accordingly, it is an object of this invention to provide an electrically-pumped interband cascade laser with inherently improved gain while simultaneously reducing the loss of quantum efficiency due to tunnelling leakage from the active quantum wells.

It is a further object of this invention to provide an interband cascade laser with a low current density threshold for lasing.

It is a further object of this invention to provide a mid-wavelength IR laser emitting high continuous wave (cw) output powers at ambient or near ambient temperatures.

These and additional objects of the invention are accomplished by the structures and processes hereinafter described.

The present invention is, in one aspect, a gain region for an interband quantum well cascade laser. This gain region includes (a) an emitter region of semiconductor material having at least one conduction subband and at least one valence subband, these subbands being spaced apart by an energy band-gap;

(b) a collector region of semiconductor material having at least one conduction subband and at least one valence subband, these subbands spaced apart by an energy band-gap;

(c) a type-I or type-II active region; and (d) a blocking quantum well region of semiconductor material between the active region and the collector region, for keeping electrons in the active region from tunnelling or scattering into the collector region, but allowing electrons in the highest valence subband in the active region to pass into the collector region.

Another aspect of the invention is a cascade laser made from a stack of these gain regions, connected in series, optical cladding regions at opposing ends of the stack, and a voltage source for applying a bias voltage to the stack, and an optical cavity perpendicular to the stacking axis fabricated by cleaving or other means.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

The following are incorporated by reference herein, in their entireties, and for all purposes:

(a) U.S. patent application No. 08/518,101, filed Aug. 22, 1995 by Rui Q. Yang, copending herewith, for "LIGHT EMITTING DEVICES BASED ON INTERBAND TRANSITIONS IN TYPE-II QUANTUM WELL HETEROSTRUCTURES", foreign priority based upon Canada Application No. 2,150,499, filed May 30, 1995;

(b) Canada Application No. 2,150,499, filed May 30, 1995;

(c) J.R. Meyer et al., "Type-II and type-I interband cascade lasers", Electronics Letters 32 (1) 45–46 (Jan. 4, 1996), and references cited therein;

(d) I. Vurgaftman et al., "High-Power/Low-Threshold Type-II Interband Cascade Mid-IR Laser - Design and Modelling", Photonics Technology Letters (in press), and references cited therein;

(e) R.Q. Yang, "INFRARED LASER BASED ON INTERSUBBAND TRANSITIONS IN QUANTUM WELLS", Superlattices and Microstructures, 17 (1) 77–83 (1995);

(f) J. Faist et al., "High power mid-infrared ($\lambda$~5 $\mu$m) quantum cascade lasers operating above room temperature", Applied Physics Letters 68(26) 3680–82 (1996).

As used herein, a quantum well region is a semiconductor layer or layers whose energy subbands are determined by quantum confinement in the presence of a barrier layer or layers on both sides of the quantum well region. In the case of a conduction band quantum well region, the band offsets must form a profile such that the conduction band edge of the quantum well layer or layers is lower in energy than the conduction band edge of the barrier layer or layers. In the case of a valence band quantum well region, the band offsets must form a profile such that the valence band edge of the quantum well layer or layers is higher in energy than the valence band edge of the barrier layer or layers. An open-gap region is a quantum well, superlattice, or layer of bulk material wherein the minimum energy of the lowest conduction band or subband is higher than the maximum energy of the highest valence band or subband, so that the two are spaced apart by an energy band-gap.

A type-I quantum well region has band offsets such that the conduction band-edge of the barrier layer or layers is higher in energy than the conduction band-edge of the well layer or layers and also the valence band edge of the barrier layer or layers is lower in energy than the valence band-edge of the well layer or layers, such that the wavefunctions for both the lowest conduction subband and the highest valence subband are localized primarily in the same quantum well layer or layers. In contrast, in a type-II region, the conduction band-edge is lowest in one layer or group of layers while the valence band edge is highest in a distinct layer or group of layers, such that the wavefunctions for the lowest conduction subband and the highest valence subband are localized primarily in different quantum well layer or layers.

Figure 1:
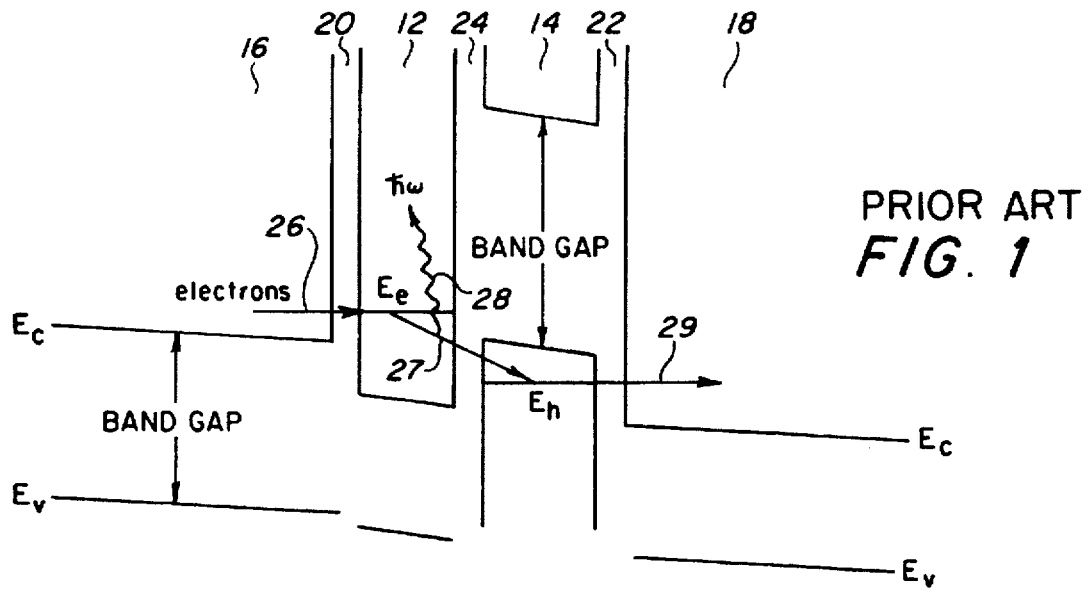
FIG. 1 depicts the energy levels of the gain region of an interband quantum well cascade laser, according to the invention of Yang.
Figure 2:
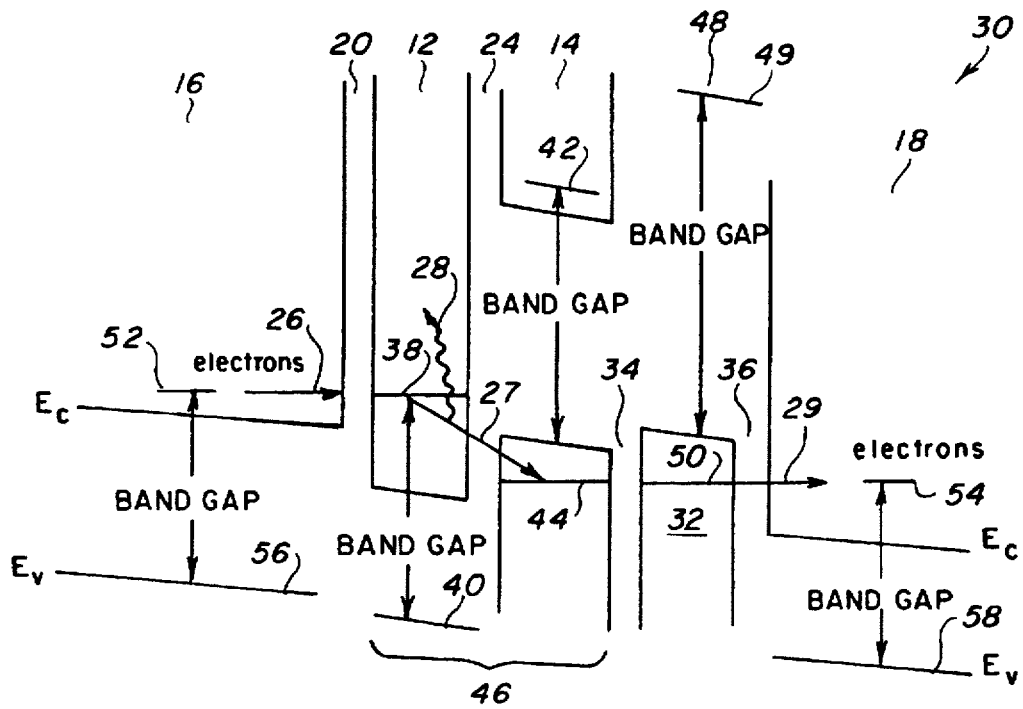
FIG. 2 depicts the energy levels of a gain region of an interband quantum well laser according to the present invention.

Referring to FIG. 2, this shows the energy levels of a gain region 30 of an interband quantum well cascade laser according to one embodiment of the present invention. Like the structure depicted in FIG. 1, this gain region has a first active quantum well (QW) region 12 and a second active QW region 14 sandwiched between an emitter region 16 and a collector region 18. The active region 46 is type-II since the wavefunction for the lowest conduction subband 38 is localized primarily in the first active QW region 12 while the wavefunction for the highest valence subband 44 is localized primarily in the second active QW region 14. Emitter region 16 is separated from the first QW region 12 by barrier 20 which is thin enough to allow electrons to flow from the emitter region 16 into the active region 46. Collector region 18 is separated from the second QW region 14 by blocking quantum well 32, and also by barrier 34 and optionally by barrier 36. The band edges of barrier layers 20, 34 and 36 are not shown and may vary for particular material systems, but it should be understood that their band-gaps must be wide enough to provide the necessary carrier confinement. Barrier layers 20, 34, and 36 can vary in thickness, but should be thin enough so that carriers can tunnel or scatter through the layers.

As shown in FIG. 2, within the first quantum well 12 there is a lowest conduction subband 38 and a highest valence subband 40. These subbands are determined by quantization in the presence of conduction and valence band profiles of the constituent layers. This lowest conduction subband 38 has an associated minimum energy, and this highest valence subband 40 has an associated maximum energy. These minimum and maximum energies are spaced apart by an energy band-gap.

Within the second quantum well 14 there is a lowest conduction subband 42 and a highest valence subband 44. These subbands are determined by quantization in the presence of conduction and valence band profiles of the constituent layers. This lowest conduction subband 42 has an associated minimum energy, and this highest valence subband 44 has an associated maximum energy. These minimum and maximum energies are spaced apart by an energy band-gap.

Together, the first and second quantum wells are referred to herein as the active region 46 of this embodiment of the invention. Between the active region 46 and the collector region 18 is a blocking quantum well 48. Within this blocking quantum well region 48 there is a lowest conduction subband 49 and a highest valence subband 50. These subbands are determined by quantization in the presence of conduction and valence band profiles of the constituent layers. This lowest conduction subband 49 has an associated minimum energy, and this highest valence subband 50 has an associated maximum energy. These minimum and maximum energies are spaced apart by an energy band-gap.

Within both the emitter region 16 and the collector region 18, there is a lowest conduction subband 52,54 and a highest valence subband 56,58. These subbands are determined by quantization in the presence of conduction and valence band profiles of the constituent layers. The lowest conduction subband 52,54 has an associated minimum energy, and the highest valence subband 56,58 has an associated maximum energy. These minimum and maximum energies are spaced apart by energy band-gaps.

The blocking quantum well region 48 is critical to the present invention. This blocking quantum well substantially reduces the leakage of electrons in subband 38 due to tunnelling or scattering through to subband 54 in the collector 18. Accordingly, the second quantum well 14 may be designed without regard to making it thick enough to prevent such leakage on its own. For example, quantum well 14 may be made thin enough to provide for substantial overlap of the electron and hole wavefunctions in the active region 46. The thickness of quantum well 14 may also be adjusted so as to avoid resonances between the laser emission photon energy $\hbar\omega$ and the energy difference between the highest valence subband 44 and any lower valence subbands in the active region. This will have the significant benefit of suppressing losses due to the non-radiative Auger recombination process and also due to valence intersubband free carrier absorption processes. For the same reasons, the active region should also be designed such that there are no resonances between the laser emission photon energy $\hbar\omega$ and the energy difference between the lowest conduction subband 38 and any higher conduction subbands in the active region. See generally I. Vurgaftman et al., supra, regarding Auger suppression. See also Grein et al. J. Appl. Phys. 76(3) 1940 (Aug. 1, 1994), incorporated by reference herein, in its entirety, for all purposes.

Many aspects of the operation of the present invention are similar to the operation of the invention of Yang. Under an appropriate forward bias, i.e., the collector layer 18 biased positively with respect to the emitter layer 16, electrons will tunnel or scatter from the conduction band of emitter layer 16 through barrier layer 20 to the subband 38 in the active region. Since the blocking region prevents leakage of electrons in subband 38 due to tunnelling or scattering into the collector region 18, only transitions to the valence subbands are probable. Furthermore, since the active region has been designed so as to suppress Auger non-radiative recombination, the probability for radiative recombination emitting a photon at the energy $\hbar\omega$ is maximized. Once the electron has relaxed to the valence band of the active region, it may then rapidly tunnel or scatter through barrier 34 to the valence band of the blocking quantum well region 48. The electron next tunnels or scatters through barrier 36 to the conduction band of the collector region 18. Although allowed interband tunnelling from a light hole subband in the blocking quantum well 48 to a conduction subband of the collector region 18 is one option, it may be preferable to either eliminate barrier 36 or make it thin enough that interband scattering from the highest heavy hole subband 50 of the blocking quantum well region 48 to the conduction band of the collector 18. Interband scattering will be rapid enough to allow high currents to flow as long as there is a sufficient overlap between the wave function for heavy hole subband 50 in the blocking quantum well region and the wavefunction of the lowest conduction subband 54 in the collector region 18.

However, a thin barrier layer 36 may be desirable, whose thickness is small enough to allow interband scattering but thick enough to reduce absorption losses due to intersubband transition between the valence subbands in the blocking quantum well region 48 and conduction subbands in the collector region 18.

The embodiment of the invention described above includes a type-II heterojunction of two quantum wells in the active region. With the creation of a population inversion, the diagonal relaxation between these two quantum wells provides the lasing emission in this embodiment of the present invention. However, another embodiment of the invention employs a type-I structure.

Figure 3:
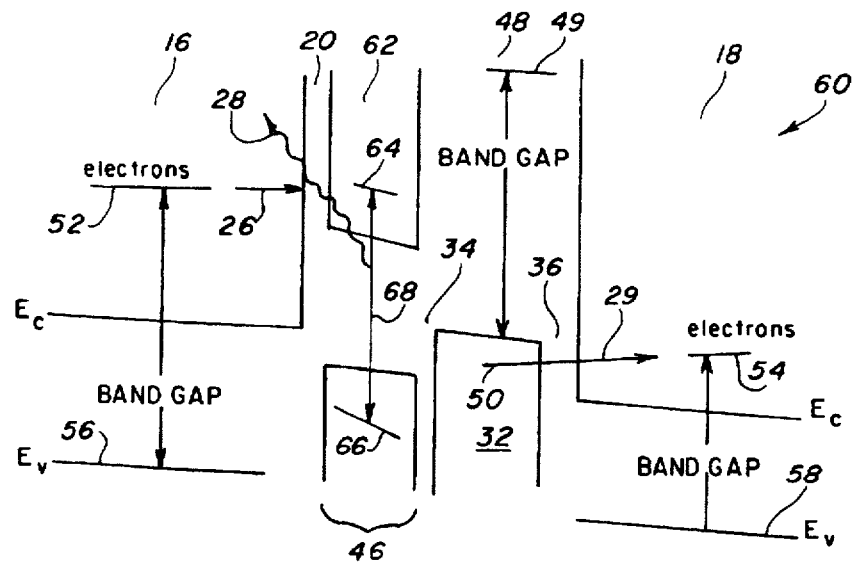
FIG. 3 depicts the energy levels of a gain region of an interband quantum well laser according to a different embodiment of the present invention.

Referring to FIG. 3, this structure differs from the preceding embodiment only in its active region. This embodiment has a quantum well region 62 with a lowest conduction subband 64 and a highest valence subband 66. These subbands are determined by quantization in the presence of conduction and valence band profiles of the constituent layers. This lowest conduction subband 64 has an associated minimum energy, and this highest valence subband 66 has an associated maximum energy. These minimum and maximum energies are spaced apart by an energy band-gap. With the creation of a population inversion, the radiative relaxation between these two energy levels provides the lasing emission in this embodiment of the present invention.

Figure 4:
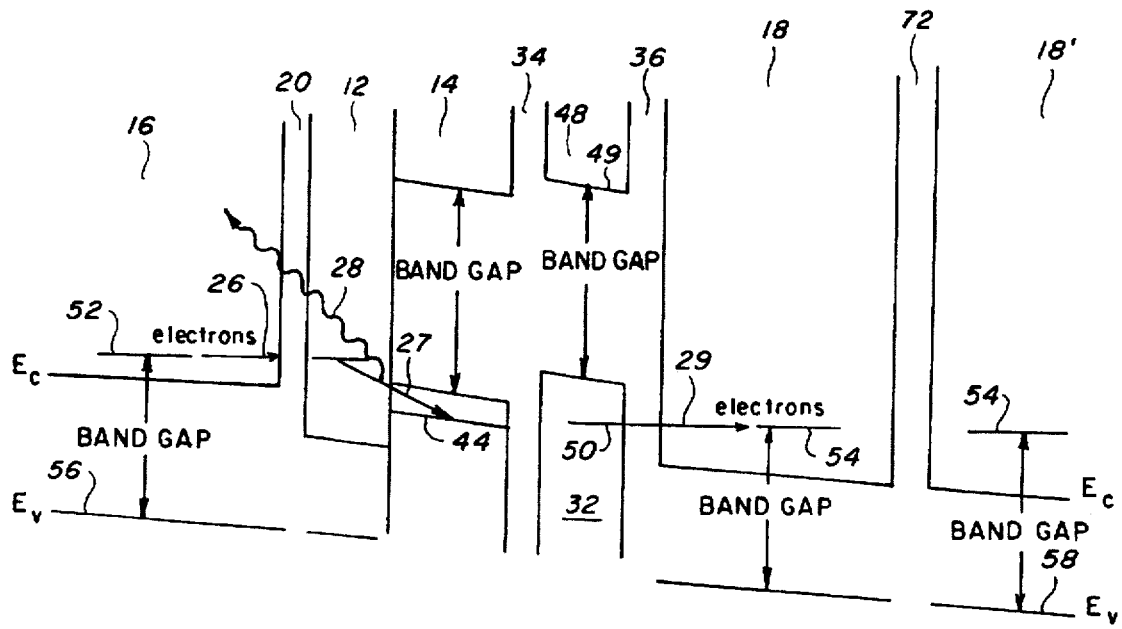
FIG. 4 depicts the energy levels of a gain region of an interband quantum well laser according to a different embodiment of the present invention.

Referring to FIG. 4, this structure shows several variations on embodiments of the present invention. Preferably, as shown in FIG. 4, there is no barrier region between the first active quantum well 12 and the second active quantum well 14. Another feature shown in this embodiment is the use of an interdigitated collector, with several collector regions 18,18' separated by one or more additional barrier regions 20. The width of the collector well region 18 may be adjusted so as to assure that under bias the minimum energy of its lowest conduction subband 54 is lower than the maximum energy of the blocking region's highest valence subband 50.

Figure 5:
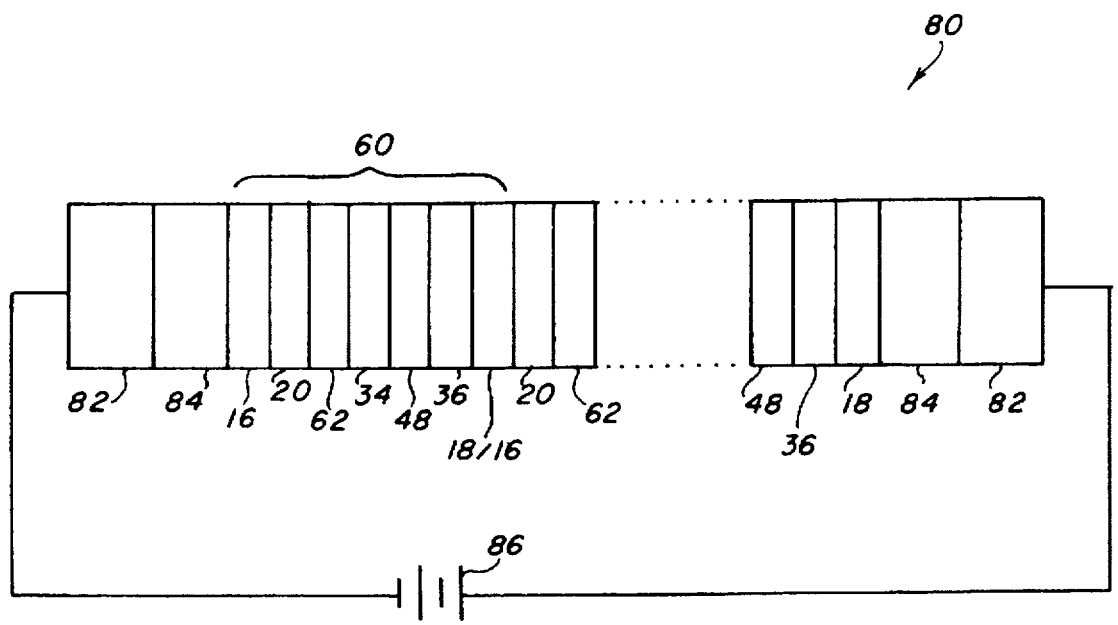
FIG. 5 schematically depicts a cascade laser according to the present invention.

Referring to FIG. 5, a plurality of the gain regions of the invention may be coupled together to make an interband quantum well cascade laser 80. A cascade laser 80 according to the present invention will have a plurality of the gain regions of the invention (e.g., a gain region 60 with a type-I active region 62) connected in series to form a stack. Thus, the collector region 18 for one gain region also serves as the emitter region 16 of the next gain region. At opposing ends of the stack are doped cladding regions 84 with lower refractive indices, which provide for internal reflection of emitted light. Cladding regions 84 are typically interposed between the stack of gain regions 60 and electrodes 82. Electrodes 82 are connected to a voltage source 86 that provides an appropriate bias to the gain regions 60. Note that since this is a cascade laser, each electron that passes through the stack may emit a photon in each gain region 60 of the stack. The gain regions are disposed in an optical cavity perpendicular to the stacking axis fabricated by cleaving or other means.

Figure 6:
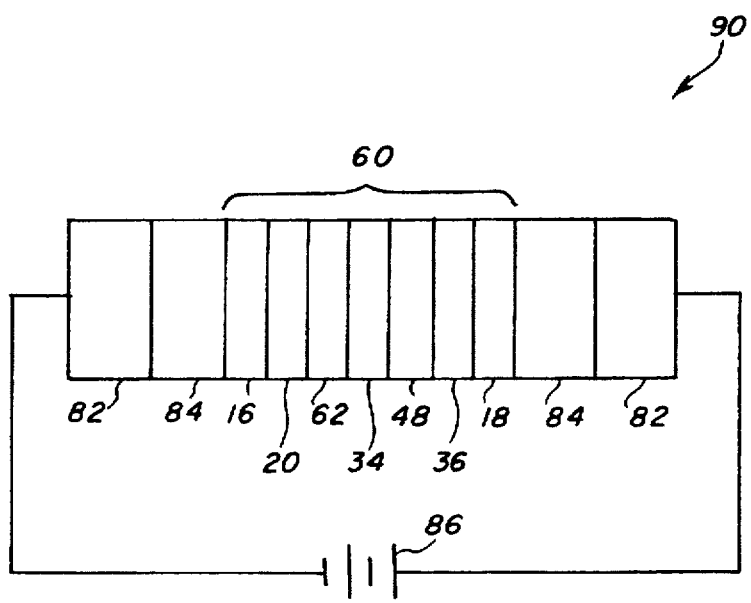
FIG. 6 schematically depicts a laser with a single gain region according to the present invention.

A cascade laser is not required, however. As shown in FIG. 6 a laser 90 according to the invention may have a single gain region 60. The gain region is disposed in an optical cavity perpendicular to the stacking axis fabricated by cleaving or other means.

Figure 7A:
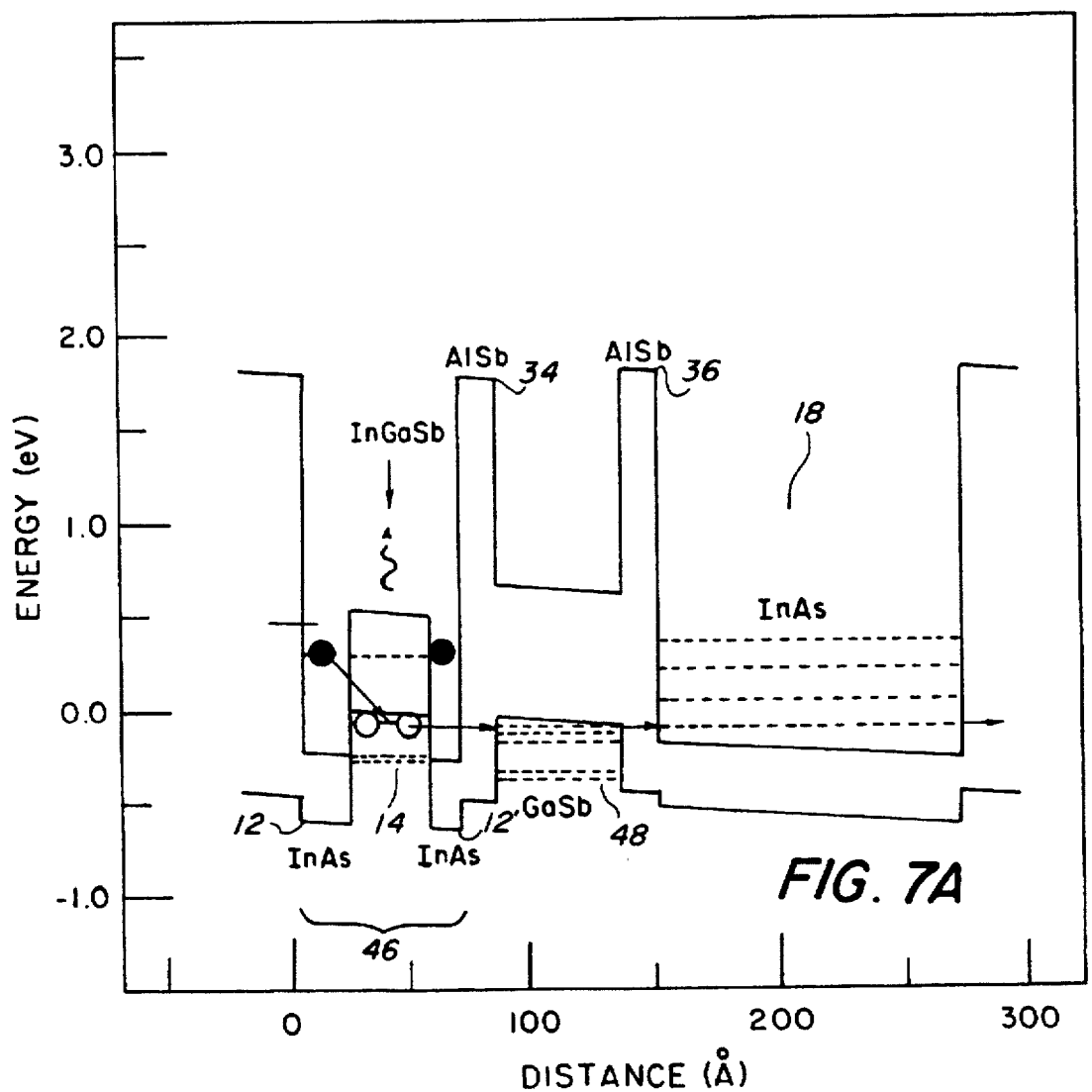
FIG. 7A depicts the energy levels of a gain region of an interband quantum well laser with an improved active region, according to the present invention.
Figure 7B:
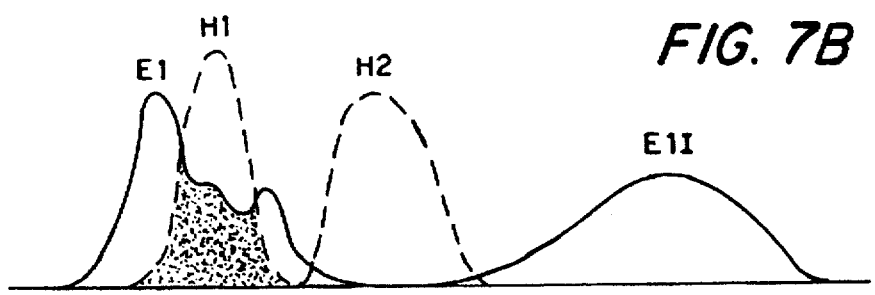
FIG. 7B depicts the electron wave function (solid line) and hole wave function (dashed line) of the gain region depicted in FIG. 7A, with the area of overlap shaded.

As noted supra, an active region according to the present invention may be a type- II quantum well region. As described supra, such an active region has two active quantum well layers. However, such an active region is open to additional active quantum well structures. The preferred gain region shown in FIG. 7A has an active region 46 with three active regions: a first active quantum well region as described supra, a second active quantum well region as described supra, and a third active quantum well region that increases the overlap of the electron wavefunction with the hole wavefunction and thereby increases the optical matrix element and gain. This increased overlap is seen in FIG. 7B.

Obviously, many modifications and variations of the present invention are possible in light of the above teachings. It is therefore to be understood that, within the scope of the appended claims, the invention may be practiced otherwise than as specifically described.

What is claimed is:

1. A gain region for an interband quantum well laser, comprising:

(a) an open-gap emitter region of semiconductor material having a lowest conduction subband and a highest valence subband;

(b) an open-gap collector region of semiconductor material having a lowest conduction subband and a highest valence subband;

(c) an active region disposed between said emitter region and said collector region, said active region selected from the group consisting of:

(i) a type-II heterojunction region, said type-II heterojunction region comprising:

(A) an open-gap first quantum well region of semiconductor material, having a lowest conduction subband and a highest valence subband, wherein under a bias voltage the minimum energy of said lowest conduction subband of said first quantum well region is lower than the minimum energy of said lowest conduction subband of said emitter region; and (B) an open-gap second quantum well region of semiconductor material, disposed between said first quantum well region and said collector region, having a lowest conduction subband and a highest valence subband, wherein under said bias voltage said maximum energy of said highest valence subband of said second quantum well region is lower than the minimum energy of said lowest conduction subband of said first quantum well region and is higher than the maximum energy of said highest valence subband of said first quantum well region; and (ii) a type-I quantum well region, said type-I quantum well region comprising:

(A) an open-gap quantum well region of semiconductor material, having a lowest conduction subband and a highest valence subband, wherein under a bias voltage, the minimum energy of said lowest conduction subband of said type-I region being lower than the minimum energy of said lowest conduction subband of said emitter region; and (d) an open-gap blocking quantum well region of semiconductor material for preventing tunnelling or scattering leakage of electrons in conduction subbands of said active region to conduction subbands in said collector region, disposed between said active region and said collector region, having a lowest conduction subband and a highest valence subband, wherein under said bias voltage, the maximum energy of said highest valence subband of said blocking quantum well region being lower than the minimum energy of said lowest conduction subband of either said first quantum well region in the case where said active region is said type-II heterojunction region, or said type-I region in the case where said active region is said type-I region, and the minimum energy of said lowest conduction subband of said blocking quantum well region being higher than the minimum energy of said lowest conduction subband of either said first quantum well region in the case where said active region is said type-II heterojunction region, or said type-I region in the case where said active region is said type-I region, and said maximum energy of said highest valence subband of said blocking quantum well being higher than the minimum energy of said lowest conduction subband of said collector region;

further comprising a second barrier region of semiconductor material, disposed between said active region and said blocking quantum well region, said second tunnel barrier region adapted for confining said hole wave function to said active region, thereby increasing said overlap between said electron wave function and said hole wave function in said active region, and further adapted for blocking electrons in said active region from tunnelling or scattering into said collector region; and further comprising a third barrier region of semiconductor material, disposed between said blocking quantum well region and said collector region, said third tunnel barrier region adapted for blocking electrons in said active region from tunnelling or scattering into said collector region and for reducing internal absorption losses due to interband transitions between said valence subbands in said blocking quantum well region and said conduction subbands in said collector region.

2. The gain region of claim 1, further comprising a voltage source for applying a bias to said gain region, sufficient to cause emission of electromagnetic energy between said lowest conduction subband and said highest valence subband of said active region.

3. The gain region of claim 2, wherein said first barrier region and said second barrier region each comprise a semiconductor layer or layers selected from the group consisting of AlSb, AlInSb, AlSbAs, AlGaSb, AlSb/InSb, AlSb/AlAs, and AlSb/GaSb.

4. The gain region of claim 3, wherein said blocking quantum well region comprises a semiconductor layer or layers selected from the group consisting of GaAb, GaInSb, GaSb/InSb, GaSb/GaInSb, GaSbAs, GaSb/GaAs, GaAlSb, and GaSb/AlSb.

5. The gain region of claim 2, wherein said active region further comprises an open-gap third quantum well region of semiconductor material, disposed on the opposite side of said second quantum well region as said first quantum well region, having a lowest conduction subband and a highest valence subband, wherein under a bias voltage the minimum energy of said lowest conduction subband of said first quantum well region is lower than the minimum energy of said lowest conduction subband of said emitter region, and wherein said third quantum well region is adapted for increasing confinement of the electron wave function in said active region.

6. The gain region of claim 1, wherein said active region is said type-II heterojunction region.

7. The gain region of claim 6, wherein said first quantum well region of said type-II heterojuction region comprises a semiconductor layer or layers selected from the group consisting of InAs, InAsSb, InAs/InSb, InGaAs, InAs/GaAs, InAlAs, and InAs/AlAs, and wherein the second quantum well region of said type-II heterojucntion comprises a semiconductor layer or layers selected from the group consisting of GaSb, GaInSb, GaSb/InSb, GaSb/GaInSb, GaSbAs, GaSbAs, GaSb/GaAs, GaAlSb, and GaSb,AlSb.

8. The gain region of claim 6, wherein said active region is said type-I region.

9. The gain region of claim 8, wherein said type-I region comprises a semiconductor layer or layers selected from the group consisting of InAs, InAsSb, InAs/InSb, InGaAs, InAs/GaAs, InAlAs, InAs/AlAs, GaAs, GaSbAs, GaSb/GaAs, and GaAlSb.

10. The gain region of claim 1, further comprising at least one additional open-gap blocking quantum well region disposed between said first blocking quantum well region and said collector region, wherein each of said additional blocking quantum well regions has a lowest conduction subband and a highest valence subband, under said bias voltage, the maximum energy of said highest valence subband of said additional blocking quantum well region being lower than the minimum energy of said lowest conduction subband of either said first quantum well region in the case where said active region is said type-II heterojunction region, or said type-I quantum well region in the case where said active region is said type-I quantum well region, and the minimum energy of said lowest conduction subband of said additional blocking quantum well region being higher than the minimum energy of said lowest conduction subband of either said first quantum well region in the case where said active region is said type-II heterojunction region, or said type-I region in the case where said active region is said type-I quantum well region, and said maximum energy of said highest valence subband of said additional blocking quantum well being higher than the minimum energy of said lowest conduction subband of said collector region.

11. The gain region of claim 1, wherein said emitter and collector regions each comprise either an analog graded quaternary InAlAsSb alloy layer or a digitally graded superlattice selected from the group consisting of InAs/AlSb, InAsSb/AlSb, InAs/AlInSb, InAsSb/AlInSb, and InAs/InSb/AlSb.

12. The gain region of claim 1, further comprising a second barrier region of semiconductor material, disposed between said active region and said blocking quantum well region, said second tunnel barrier region adapted for confining said hole wave function to said active region, thereby increasing said overlap between said electron wave function and said hole wave function in said active region, and further adapted for blocking electrons in said active region from tunnelling or scattering into said collector region.

13. The gain region of claim 1, further comprising a third barrier region of semiconductor material, disposed between said blocking quantum well region and said collector region, said third tunnel barrier region adapted for blocking electrons in said active region from tunnelling or scattering into said collector region and for reducing internal absorption losses due to interband transitions between said valence subbands in said blocking quantum well region and said conduction subbands in said collector region.

14. The gain region of claim 13, further comprising a fourth barrier region of semiconductor material, disposed between said collector region and a second collector region, with the thickness of said collector region and the quantum confinement induced by said fourth barrier region adapted for causing, under said bias voltage, the minimum energy of said lowest conduction subband of said collector region to be lower than the maximum energy of said highest valence subband of said blocking quantum well region.

15. The gain region of claim 1, wherein said active region and said blocking quantum well region are adapted for reducing Auger non-radiative losses and free-carrier absorption losses by assuring that under said bias voltage, the energy of the photon emitted from said gain region is not near resonance with the energy difference between the minimum energy of said lowest conduction subband of said active region and the minimum energy of any higher conduction subband of said active region, and by assuring that under said bias voltage the energy of said photon emitted from said gain region is not near resonance with the energy difference between the maximum energy of said highest valence subband of said active region and the maximum energy of any lower valence subband of said active region, and by assuring that under said bias voltage the energy of said photon emitted from said gain region is not near resonance with the energy difference between the maximum energy of said highest valence subband of said blocking quantum well region and the maximum energy of any lower valence subband of said blocking quantum well region.

16. The gain region of claim 1, wherein said collector region is a superlattice, and wherein the non-radiative loss due to free carrier absorption is reduced through assuring that under said bias voltage the energy of the photon emitted from said gain region is not near resonance with the energy difference between the minimum energy of the lowest conduction subband of any quantum well in said superlattice and the minimum energy of any higher conduction subband of said quantum well in said superlattice.

17. An interband quantum well cascade laser, comprising:
a plurality of gain regions connected in series to form a stack, each gain region comprising:
  (a) an open-gap emitter region of semiconductor material having a lowest conduction subband and a highest valence subband, wherein a minimum energy of said lowest conduction subband and a maximum energy of said highest valence subband are spaced apart by an energy band-gap;
  (b) an open-gap collector region of semiconductor material having a lowest conduction subband and a highest valence subband;
  (c) an active region disposed between said emitter region and said collector region, said active region selected from the group consisting of:
    (i) a type-II heterojunction region, said type-II heterojunction region comprising:
      (A) an open-gap first quantum well region of semiconductor material, having a lowest conduction subband and a highest valence subband, wherein under a bias voltage the minimum energy of said lowest conduction subband of said first quantum well region is lower than the minimum energy of said lowest conduction subband of said emitter region; and
      (B) an open-gap second quantum well region of semiconductor material, disposed between said first quantum well region and said collector region, having a lowest conduction subband and a highest valence subband, wherein under said bias voltage said maximum energy of said highest valence subband of said second quantum well region is lower than the minimum energy of said lowest conduction subband of said first quantum well region and is higher than the maximum energy of said highest valence band of said first quantum well region; and
    (ii) a type-I region, said type-I region comprising:
      (A) an open-gap quantum well region of semiconductor material, having a lowest conduction subband and a highest valence subband, wherein under a bias voltage, the minimum energy of said lowest conduction subband of said type-I region being lower than the minimum energy of said lowest conduction subband of said emitter region; and
  (d) an open-gap blocking quantum well region of semiconductor material for preventing tunnelling or scattering leakage of electrons in conduction subbands of said active region to conduction subbands in said collector region, disposed between said active region and said collector region, having a lowest conduction subband and a highest valence subband, wherein under said bias voltage, the maximum energy of said highest valence subband of said blocking quantum well region being lower than the minimum energy of said lowest conduction subband of either said first quantum well region in the case where said active region is said type-II heterojunction region, or said type-I region in the case where said active region is said type-I region, and the minimum energy of said lowest conduction subband of said blocking quantum well region being higher than the minimum energy of said lowest conduction subband of either said first quantum well region in the case where said active region is said type-II heterojunction region, or said type-I region in the case where said active region is said type-I region, and said maximum energy of said highest valence subband of said blocking quantum well being higher than the minimum energy of said lowest conduction subband of said collector region;

further comprising a second barrier region of semiconductor material, disposed between said active region and said blocking quantum well region, said second tunnel barrier region adapted for confining said hole wave function to said active region, thereby increasing said overlap between said electron wave function and said hole wave function in said active region, and further adapted for blocking electrons in said active region from tunnelling or scattering into said collector region; and further comprising a third barrier region of semiconductor material, disposed between said blocking quantum well region and said collector region, said third tunnel barrier region adapted for blocking electrons in said active region from tunnelling or scattering into said collector region and for reducing internal absorption losses due to interband transitions between said valence subbands in said blocking quantum well region and said conduction subbands in said collector region;

cladding layers at opposing ends of said stack; and a voltage source, for applying a bias to said stack;

said stack disposed in an optical cavity.

18. The laser of claim 17, wherein said active region is said type-II heterojunction region.

19. The laser of claim 17, wherein said active region is said type-I region.

20. The laser of claim 17, further comprising at least one additional blocking quantum well region disposed between said first blocking quantum well region and said collector region, wherein each of said additional blocking quantum well regions has a lowest conduction subband and a highest valence subband, said subbands determined by quantization in the presence of conduction and valence band profiles of constituent layers, and a minimum energy of said lowest conduction subband and a maximum energy of said highest valence subband being spaced apart by an energy band-gap. and having. under said bias voltage. the maximum energy of said highest valence subband of said additional blocking quantum well region being lower than the minimum energy of said lowest conduction subband of either said first quantum well region in the case where said active region is said type-II heterojunction region. or said type-I region in the case where said active region is said type-I region. and the minimum energy of said lowest conduction subband of said additional blocking quantum well region being higher than the minimum energy of said lowest conduction subband of either said first quantum well region in the case where said active region is said type-II heterojunction region. or said type-I region in the case where said active region is said type-I region. and said maximum energy of said highest valence subband of said additional blocking quantum well being higher than the minimum energy of said lowest conduction subband of said collector region.

21. The laser of claim 17. further comprising a voltage source for applying a bias to said gain region. sufficient to cause emission of electromagnetic energy between said lowest conduction subband and said highest valence subband of said active region.

22. The laser of claim 17. wherein said emitter and collector regions each comprise either an analog graded quaternary InGaAsSb alloy layer or a digitally graded superlattice selected from the group consisting of InAs/AlSb. InAsSb/AlSb. InAs/AlInSb. InAsSb/AlInSb. and InAs/InSb/AlSb.

23. The laser of claim 17. wherein said emitter and collector regions comprise materials selected to fix the net lattice constant of said gain region.

24. The laser of claim 17. further comprising a first tunnel barrier region of semiconductor material. disposed between said emitter region and said active region. said first tunnel barrier region adapted for confining an electron wave function to said active region. thereby increasing an overlap between said electron wave function and a hole wave function in said active region.

25. The laser of claim 24. further comprising a second tunnel barrier region of semiconductor material. disposed between said active region and said blocking quantum well region. said second tunnel barrier region adapted for confining said hole wave function to said active region. thereby increasing said overlap between said electron wave function and said hole wave function in said active region. and further adapted for blocking electrons in said active region from tunnelling or scattering into said collector region.

26. An interband quantum well laser, comprising:
a gain region comprising:
  (a) an open-gap emitter region of semiconductor material having a lowest conduction subband and a highest valence subband. wherein a minimum energy of said lowest conduction subband and a maximum energy of said highest valence subband are spaced apart by an energy band-gap;
  (b) an open-gap collector region of semiconductor material having a lowest conduction subband and a highest valence subband;
  (c) an active region disposed between said emitter region and said collector region. said active region selected from the group consisting of:
    (i) a type-II heterojunction region, said type-II heterojunction region comprising:
      (A) an open-gap first quantum well region of semiconductor material. having a lowest conduction subband and a highest valence subband, wherein under a bias voltage the minimum energy of said lowest conduction subband of said first quantum well region is lower than the minimum energy of said lowest conduction subband of said emitter region;and
      (B) an open-gap second quantum well region of semiconductor material. disposed between said first quantum well region and said collector region. having a lowest conduction subband and a highest valence subband. wherein under said bias voltage said maximum energy of said highest valence subband of said second quantum well region is lower than the minimum energy of said lowest conduction subband of said first quantum well region and is higher than the maximum energy of said highest valence band of said first quantum well region;and
    (ii) a type-I region, said type-I region comprising:
      (A) an open-gap quantum well region of semiconductor material. having a lowest conduction subband and a highest valence subband, wherein under a bias voltage. the minimum energy of said lowest conduction subband of said type-I region being lower than the minimum energy of said lowest conduction subband of said emitter region; and
  (d) an open-gap blocking quantum well region of semiconductor material for preventing tunnelling or scattering leakage of electrons in conduction subbands of said active region to conduction subbands in said collector region. disposed between said active region and said collector region, having a lowest conduction subband and a highest valence subband, wherein under said bias voltage, the maximum energy of said highest valence subband of said blocking quantum well region being lower than the minimum energy of said lowest conduction subband of either said first quantum well region in the case where said active region is said type-II heterojunction region, or said type-I region in the case where said active region is said type-I region, and the minimum energy of said lowest conduction subband of said blocking quantum well region being higher than the minimum energy of said lowest conduction subband of either said first quantum well region in the case where said active region is said type-II heterojunction region, or said type-I region in the case where said active region is said type-I region, and said maximum energy of said highest valence subband of said blocking quantum well being higher than the minimum energy of said lowest conduction subband of said collector region;

further comprising a second barrier region of semiconductor material. disposed between said active region and said blocking quantum well region. said second tunnel barrier region adapted for confining said hole wave function to said active region, thereby increasing said overlap between said electron wave function and said hole wave function in said active region. and further adapted for blocking electrons in said active region from tunnelling or scattering into said collector region; and further comprising a third barrier region of semiconductor material. disposed between said blocking quantum well region and said collector region, said third tunnel barrier region adapted for blocking electrons in said active region from tunnelling or scattering into said collector region and for reducing internal absorption losses due to interband transitions between said valence subbands in said blocking quantum well region and said conduction subbands in said collector region; cladding layers at opposing ends of said gain region; and a voltage source, for applying a bias to said gain region; said stack disposed in an optical cavity.

* * * * *